United States Patent
Hynell

(10) Patent No.: US 8,777,174 B2
(45) Date of Patent: Jul. 15, 2014

(54) LAPTOP COMPUTER SUPPORT

(75) Inventor: Harald Hynell, Stockholm (SE)

(73) Assignee: Bosign Aktiebolag, Stockholm (SE)

( * ) Notice: Subject to any disclaimer, the term of this patent is extended or adjusted under 35 U.S.C. 154(b) by 264 days.

(21) Appl. No.: 13/201,029

(22) PCT Filed: Feb. 11, 2010

(86) PCT No.: PCT/SE2010/050160
§ 371 (c)(1),
(2), (4) Date: Aug. 15, 2011

(87) PCT Pub. No.: WO2010/093321
PCT Pub. Date: Aug. 19, 2010

(65) Prior Publication Data
US 2011/0309222 A1 Dec. 22, 2011

(30) Foreign Application Priority Data
Feb. 12, 2009 (SE) .................................. 0900179

(51) Int. Cl.
*G06F 1/16* (2006.01)
*A47B 21/00* (2006.01)
*G06F 1/20* (2006.01)
*H05K 5/00* (2006.01)

(52) U.S. Cl.
CPC ............... *G06F 1/1628* (2013.01); *G06F 1/20* (2013.01); *A47B 21/00* (2013.01); *H05K 5/00* (2013.01); *Y10S 248/918* (2013.01)
USPC ................. 248/346.01; 248/918; 361/679.55; 361/687; 361/688

(58) Field of Classification Search
USPC ......... 248/346.01, 346.11, 174, 118.5, 349.1, 248/918; 428/141, 236, 354, 458, 462; 361/683, 679.46, 679.48, 679.55, 687, 361/688, 695; 108/43, 50.01
See application file for complete search history.

(56) References Cited

U.S. PATENT DOCUMENTS

| | | | |
|---|---|---|---|
| 6,269,948 B1 * | 8/2001 | Jackson | 206/320 |
| 6,305,652 B1 * | 10/2001 | Borke et al. | 248/174 |
| 6,466,438 B1 | 10/2002 | Lim | |
| 6,682,040 B1 * | 1/2004 | MacEachern | 248/349.1 |
| 7,121,214 B1 * | 10/2006 | Toltzman et al. | 108/43 |
| 7,161,799 B2 * | 1/2007 | Lim et al. | 361/679.55 |
| 7,322,063 B2 * | 1/2008 | Esimai | 5/652.1 |

(Continued)

FOREIGN PATENT DOCUMENTS

DE 102004010322 A1 1/2005
JP 3053486 8/1998

OTHER PUBLICATIONS

International Search Report and Written Opinion (mailed May 6, 2010).

(Continued)

*Primary Examiner* — Tan Le
(74) *Attorney, Agent, or Firm* — Jeffrey S. Melcher; Manelli Selter PLLC

(57) ABSTRACT

A laptop computer support platform for resting a portable personal computer on. The computer support platform having a non-rigid base structure having one or several risers to establish an air gap between the non-rigid base and the laptop computer. The air gap acts as an insulating medium and contributes to a thermal cooling effect of the laptop computer.

8 Claims, 3 Drawing Sheets

(56) References Cited

U.S. PATENT DOCUMENTS

| | | | |
|---|---|---|---|
| 7,625,625 B2 * | 12/2009 | Rios et al. | 428/141 |
| 7,778,025 B1 * | 8/2010 | Huang | 361/679.48 |
| 7,857,276 B2 * | 12/2010 | Chen | 248/346.01 |
| 2002/0003197 A1 | 1/2002 | Maceachern | |
| 2003/0058615 A1 | 3/2003 | Becker | |
| 2005/0276006 A1 | 12/2005 | Lim | |
| 2006/0232935 A1 | 10/2006 | Xiong | |
| 2006/0256517 A1 | 11/2006 | Taylor | |
| 2008/0061207 A1 | 3/2008 | Panziera | |
| 2009/0034188 A1 | 2/2009 | Sween | |
| 2009/0162651 A1 * | 6/2009 | Rios et al. | 428/354 |

OTHER PUBLICATIONS http://ergo.human.cornell.edu/hotlaptops.html (dated Dec. 8, 2005).

Office Action issued May 29, 2013 in corresponding Japanese patent application No. 2011-550093.

* cited by examiner

LAPTOP COMPUTER SUPPORT

CROSS-REFERENCE TO RELATED APPLICATIONS

This application is a national stage entry under 35 U.S.C. 371 of International Application No. PCT/SE2010/050160, filed 11 Feb. 2010, designating the United States. This application claims foreign priority under 35 U.S.C. 119 and 365 to Swedish Patent Application No. 0900179-3, filed 12 Feb. 2009. The complete contents of these applications are incorporated herein by reference.

FIELD OF THE INVENTION

The present invention relates to the field of portable personal computers and more particularly to an insulating air pocket created in connection with a portable personal computer to shield any underlaying surface from heat generated by the portable personal computer. Using a non skid material on the risers/risers supporting the portable personal computer allows it being angled or adjusted without sliding. It also adds the feature of allowing the operator a comfortable and ergonomic working position. By using a non rigid base as a heat shield for the supporting portable platform the portability and storing possibilities will be enhanced and create better comfort for the person operating the lap top computer.

BACKGROUND OF THE INVENTION

The rapid increase in numbers of portable personal computers, laptop computers or net books is a well known fact. According to research firm iSuppli, the number of sold laptop computers around the world surpassed the sales of desktop consoles for the first time in the third quarter of 2008.

Since the laptop computers are performing more and more various tasks, they need to be stronger, quicker and contain more components such as wireless connection cards, dvd player, advanced graphic card and extra processors. This is performed in the same way as in a desktop but in a much smaller and compact area. This process generates a vast amount of heat. The typical working temperature manufactures recommend for laptop computers is normally 35-40° C., at 40-50° C. you will double the chances of hard disk crash (http://ergo.human.cornell.edu/hotlaptops.html). The effectiveness of the ventilation is reduced when the laptop is placed directly on a person's lap, pillow, or solid surface. The major difference from a desktop is that there is not enough room for large cooling fans, open space or other cooling equipment as heat sinks to reduce the heat generated. This leads to the fact that the construction of the laptop transfer most of the heat generated through the underside of the computer where it comes in contact with the media underneath. The users of lap tops have a high demand for long battery life to be able to perform their tasks at any location lacking of a external power supply. This request contradict the use of the battery's energy for cooling the personal laptop computer in a more efficient way. The heat generated can damage the surface i.e a desk, table or furniture, discomfort and even cause physical injury or harm to the person using it or causing the laptop computer to get damaged.

Laptops are often used by mobile people either traveling or commuting to perform virtually all of the tasks that could be performed by a desktop computer. Therefore waiting and traveling hours can be productive during transportation on waiting areas such as airports, train- and bus stations or during travel by airplanes, trains, busses and in hotels stays. Laptops also give the benefit of conducting meetings, projects, lectures, follow the news and conducting business at almost any location outside of the office.

A very important factor in using the laptop computers during mobility is the growing possibilities of using high speed wireless connection such as Wi-Fi, Wimax, GSM or local lans at virtually any urban area. This enable people to connect the computer and receive/transfer data from the internet or a remote host. This makes the usage of the personal laptops similarly efficient to a traditional desktop computer with cable connection to a local network.

Another factor is the increased use of personal laptops in private homes. Family members are now performing numerous tasks, internet banking, shopping, dictionary and encyclopedia service, photo video editing, games, watching TV, homework and different forms of net community interactions. These tasks can often been carried out simultaneously among the family members. So there is a need for more than one computer within a family home. The use of laptops in offices and in homes offer an alternative to bulkier, space consuming desk top models requiring at least one or several supporting furniture units per desktop computer. Using laptops at home will not only save space but also gives the opportunity to be mobile at home which enable you to perform various tasks at different locations within the home and have the benefit of using the laptop computer at the preferred location.

The need to bring along the laptop on holidays, within the home, at business, at traveling and to school make them almost absolutely necessary in daily life to perform everyday chores in an efficient or entertaining way. Since mobility among all consumers is an important factor the demand is more light weight and smaller portable personal computers. The more mobility that is required the smaller and more light weight is the demand. Also the more frequent and longer duration of use of the laptop creates a demand on operating it in a comfortable and ergonomic position.

When the mobility of the consumer includes leaving the home or office the less weight or volume they like to bring along. At home there is a demand for less bulky products and easy store away solutions.

Thus one major reason to the increased use of laptop computers is the fact that they are mobile and can be used on different locations or outside of the home/office. They can use it before, during and after the traveling and as in all traveling any extra weight or bulk is unwelcome.

Additionally, the mobility of usage of the personal laptop computer in different environments and places compared to a fixed ergonomic controlled work station creates a demand for an ergonomic supporting mobile operating station. One problem connected to the use of personal computers during mobility is that they easily slide around when placed on a non leveled surface e.g. a person's lap. The non slid rubber pads on the lap top computer are not always placed at the correct position to match a flexible surface such as the laps of different persons. Thus the need to adjust the body instead of the laptop computer could result in positioning oneself in a non ergonomic position. Using a non ergonomic position repetitively or for a prolonged period of time can cause physical injury or harm. There is also a risk that the personal computer will slide off the lap and become damaged.

A non rigid platform can adjust to an uneven surface such as a person's lap. In addition this adaptation to a person's body, preferably the lap, will create good comfort and a better ergonomic operating position.

In view of the above various solutions and methods have been attempted to solve those problems. One example is the ilap from Rain design inc. with a heat dissipating and ergonomically designed versatile lap top stand. It features an angled anodized aluminum base with a soft padded riser. However the ilap lacks of portability since it is bulky and heavy, two important factors to consider while traveling. Nor is it adoptable to various sizes of lap top computers. Also U.S. Pat. No. 7,275,724 to Ward disclose a lap top computer support platform including a rigid multilayered assembly with a thermal insulator and risers to allow air to circulate. However the device is ill-suited for storing, comfort and portability due to its rigid platform which is neither flexible nor bendable. Since it is rigid it has no adaptation and does not shape itself to the surface it is resting upon, e.g. a person's lap. Furthermore, it is heavy and bulky and is not possible to bend, three important features wanted when traveling or storing an item. In addition U.S. Pat. No. 7,161,799 to Lim et al. disclose a thermal insulating board for laptop computers with a rigid platform board in checkerboard construction with risers to create a cooling effect. Due to the rigid board construction it is not bendable, foldable and rather thick. This is a disadvantage when storing and traveling. Furthermore, it does not shape itself to the surface underneath. This is an important factor, as discomfort can arise from hard edges when placed in a person's lap, and it will not adapt to different body structures or the space allowed when placed in a seat with limited space, e.g. an airplane, bus, train or narrow chair.

Another product marketed by Bosign AB of Stockholm Sweden called the "Lap Tray" (www.bosign.se), comprising of a rigid tray connected with velcro to a soft adapting pillow, aims to create a stabile and heat shielding working position. However, this product is bulky and heavy, two important disadvantages for storing and traveling.

Thus the need and demand for a non rigid personal computer platform that is light weight, of low volume, portable and offers flexible storage possibilities is high. Furthermore, it must offer an ergonomic, comfortable operating position in various environments in addition to dissipating heat from the bottom of the personal laptop computer.

SUMMARY OF THE INVENTION

In aspect of the above described the present invention is directed to a light weight non rigid laptop computer support platform. The thermal insulating shield consists of a non rigid platform and the cooling effect is provided by adding non slip riser/risers creating a thermal cooling effect by allowing the air to circulate between the laptop and the non rigid platform. This will transfer the heat from the portable personal computer away from the surface which it is placed upon. The number of risers may be one or plural or removable. The non rigid support platform will make the platform flexible in various storage situations, i.e it could be bent, rolled up, folded together and therefore be transformed in to a diversity of shapes and sizes. This enables multiple options for storage in homes, offices, traveling and during transportation.

In addition to the multiple storage function described above the invention offers advantages while operating the computer during mobility. Having a non rigid platform will enhance the comfort while operating the computer in various positions, such as sitting on the ground, a sofa, bed, chair, bench or traveling with different transportation facilities. The non rigid laptop computer support platform is formable and can adapt to any supporting surface or body part.

To enhance the portability the platform support could in the most preferred form be extremely light weight and thin, at about 40 g weight and, and a thickness of only 4 mm. Furthermore the platform supported in this invention is non rigid which allows it to be flexible. This factor will enable the supported platform to fit into most of the existing laptop computer storage cases or travel luggage. To further improve mobility it is possible to integrate the non slip risers onto a non rigid material which can include a storage case for the lap top computer or other travel compartments. Moreover, used in the home area or offices this invention of a non rigid platform can be very easily stored in numerous places or act as a part of the interior design if integrated or attached on to non rigid furniture or decoration material such as woven, knitted or felt fabrics. This will enhance the aesthetic look and could be coordinated as a part of the surrounding interior. Furthermore, the slight weight and slim volume makes it cost effective to distribute.

Alternatively the non slid risers could be attached to a non rigid material of preferably woven, knitted, cloth or felt fabric shaped as a case. The risers are attached on the outside of the case giving the possibility to use the case as a platform upon which the lap top rests. For higher comfort and to minimize the effect of heat transferring from the lower part of the computer to the persons lap during the use of the computer, the case could be filled with a soft lightweight, formable and isolating material. Such isolating material could be foam, feathers, expandable polymeric material or other suitable material inhibiting heat transfer and adding formability. By forming and adapting to the person's body or surface which the non rigid computer platform will rest upon, the platform can be prevented to move or slide off while operating the laptop computer in different positions. Additionally the formability and adaption to a person's body will enable the operator to adjust the laptop platform including the portable personal computer into multiple angels and positions. This enhances the possibility to operate the laptop computer in a comfortable and ergonomic way.

Another feature is that the present invention does not require the user of the laptop to intersect the footpads' placements with the risers/risers on the non rigid support platform. Since the risers are of a non slid material they will prevent the laptop computer to slide. Thus the invention can be used with any size of portable computer. Moreover the platform is non rigid which enables this invention to offer risers of very low elevations, even lower than the computer's footpads. In the event of the footpads being of higher elevation than the risers, the foot pads can sink in to the non rigid platform. If this is the case some of the cooling effect will be reduced, but the prevention of the computer to slide will remain. However, in most cases the risers are of higher elevation than the footpads of the portable computer, thus retaining the thermal cooling effect.

The aforementioned and other advantages and features of this invention will be described in further detail and become readily apparent hereinafter in the following description of the drawing, the detailed description and the appended claims.

DETAILED DESCRIPTION OF PREFERRED EMBODIMENTS

Figure 1:
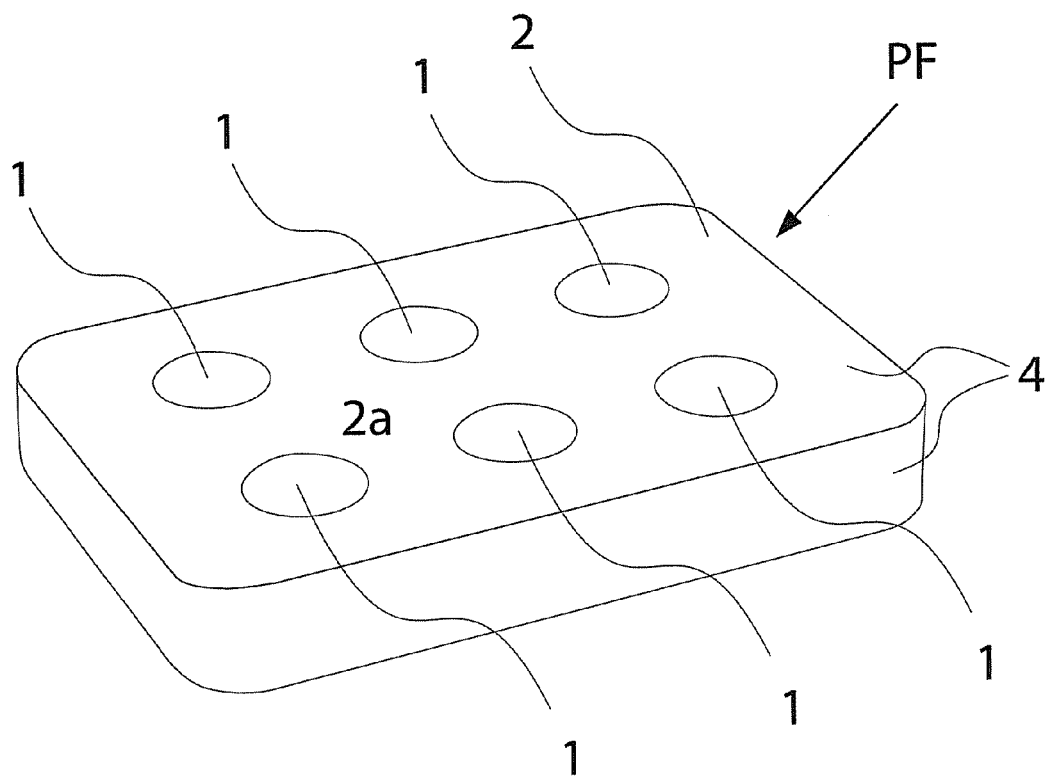
FIG. 1 is an elevated, perspective view of an embodiment of the present invention with six support members.
Figure 2:
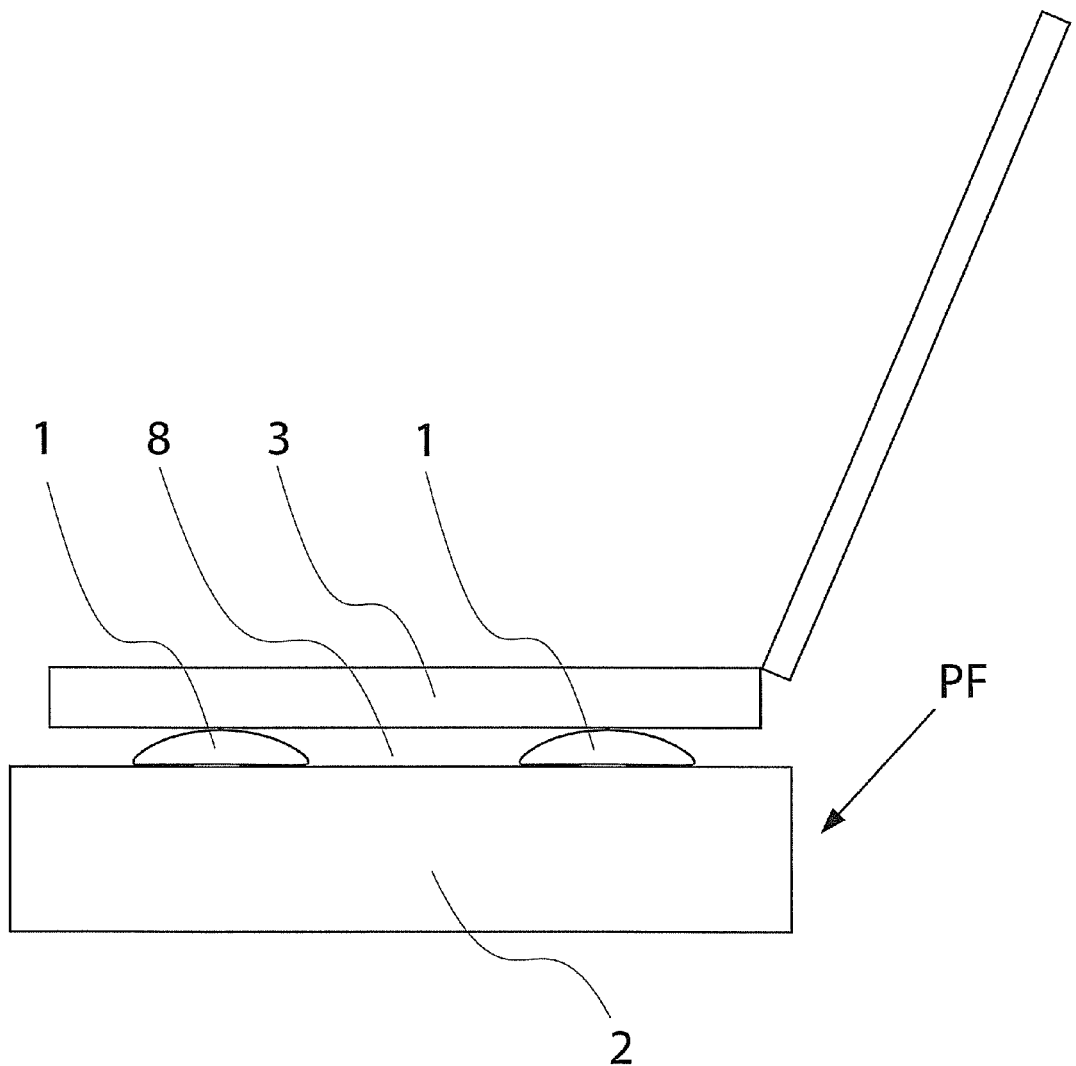
FIG. 2 is an horizontal view of an embodiment of the present invention with a computer placed on its support members.
Figure 3:
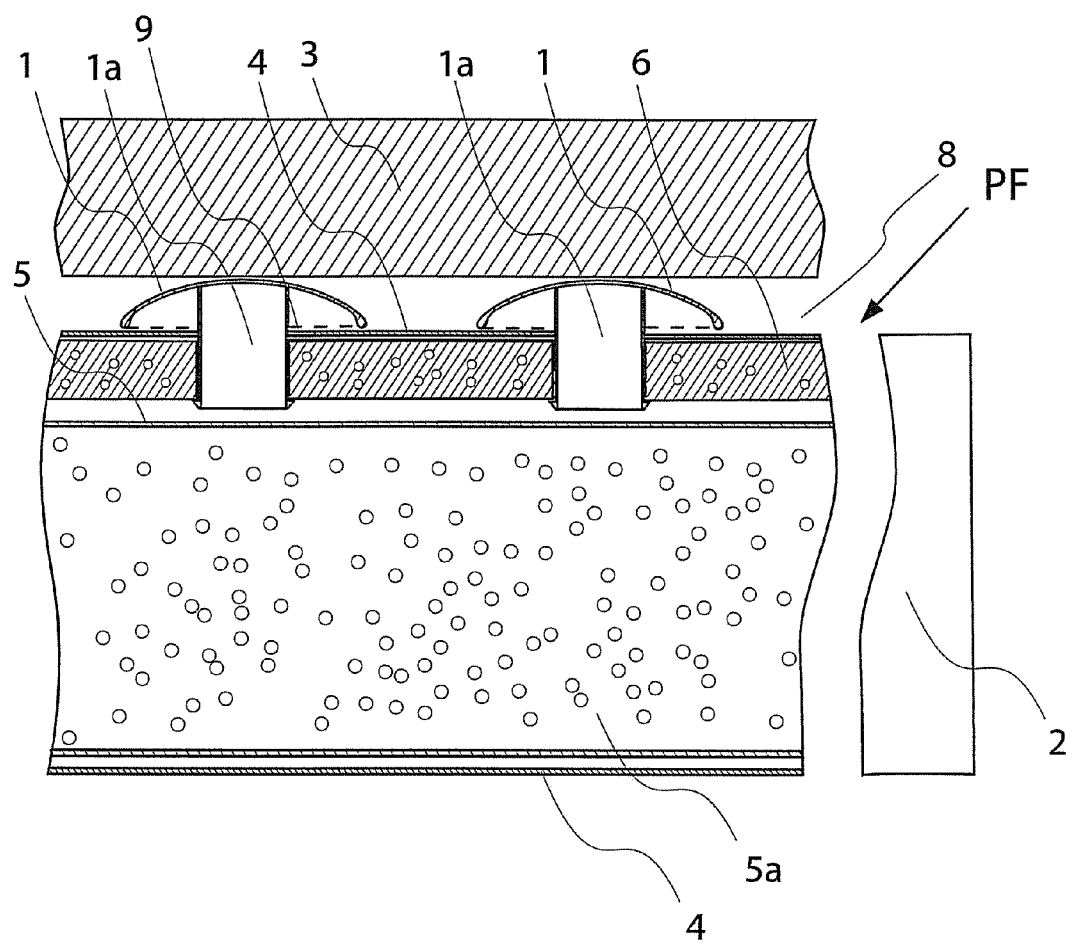
FIG. 3 is an horizontal cut away view of an embodiment of the present invention with a computer placed on its support members.

An embodiment of the heat reducing and stabilizing laptop computer platform PF of the present invention is shown in FIGS. 1, 2 and 3, which disclose a non rigid support platform base 2 having one or several support members, hereafter "risers", 1 placed on it to create a stabilizing foundation for a portable personal laptop computer, hereafter "laptop" 3. By distancing the laptop 3 from platform base 2 a cooling air layer 8 is created. The temperature of the laptop 3 is reduced by enabling convection in the heat insulating pocket of air 8. The temperature of the platform base 2 is further reduced by reducing the area of the platform in contact with the laptop 3 and thus reducing the conducted heat between the laptop 3 and the platform base 2. The conducted heat through the platform base 2 from a laptop 3 to a lap of an operator placed underneath is thus reduced to a proportional extent. The material of the platform base 2 may have or not have heat insulating properties. An embodiment with heat insulating properties of the material of the platform base 2 would further reduce the heat transferred from a warm laptop 3 to an operators lap. The heat insulating capacity of the platform base 2 is proportional to the thickness of the base. The platform base 2 may consist of a thin solid layer made of a flexible material like woven cloth, polymer, and polymeric foam.

The platform base 2 may also consist of a plurality of layers with different properties. In an preferred embodiment shown in FIG. 3 which disclose a platform base 2 comprising a case 4 made of a thin flexible material, i.e. textile, a thicker semi flexible layer 6 made of i.e. polymeric foam and a cushion 5 with soft or granular filling 5a. In the preferred embodiment shown in FIG. 3 risers 1 are mounted in the platform base 6 through holes 9 in a platform base member 6 and are removable to enable washing of the case.

The combined set of platform member 6 and risers 1 will adapt to the flat surface of the laptop 3 when squeezed between the weight of the laptop 3 and the operators lap underneath. The top layer of casing 4 in FIG. 3 will as a result be flattened out by the platform member 6 and risers 1 and prevented from folding and thus reducing the size of the heat reducing pocket 8 of air.

In one embodiment the support platform base 2 consists only of a base member 6 and one or several risers 1.

In another embodiment the laptop support platform PF have a support base 2 that also functions as a laptop computer case and/or a computer bag.

In another embodiment the laptop support platform PF the support base 2 could be in the form of clothing e.g. a coat, where the part over the lap could have one or several support members to provide a heat reducing and stabilizing computer support.

The invention claimed is:

1. A laptop computer support platform, on which a portable personal computer may be rested, comprising:
   a support platform base having a top surface which is directed towards the laptop computer optionally resting on the computer support platform;
   one or more laptop support members projecting from said top surface of the platform base and contacting said laptop computer resting on the computer support platform, thereby creating a heat insulating pocket of air between said top surface of the support platform and said laptop computer, and
   at least one support platform base member under said one or more projecting laptop support members, which at least one base member is made of a flexible material of less rigidity than the projecting laptop support members, said one or more laptop support member(s) being secured to said at least one base member, wherein said one or more laptop support member is/are provided with at least one rod shaped male portion, at least part of which is secured in a correspondingly shaped hole in the at least one base member,
   wherein the one or more laptop support member(s) is/are provided with a contact member which becomes narrower in a direction from said at least one support platform base member towards said laptop computer,
   wherein one or more laptop support member(s) has/have the shape of a mushroom with a stem and a cap, said stem defining said rod shaped male portion at least part of which is secured in a correspondingly shaped hole in the at least one base member, and said cap defining said contact member which becomes narrower in said direction from said at least one support laptop base member towards said laptop computer,
   wherein the said at least one laptop support base member is accommodated in a casing, and wherein said member is a single to base member in said casing and has an extension in a plane parallel with said to surface substantially corresponding to the extension of said to surface,
   wherein the casing also contains a cushion under the flexible laptop support base member, which cushion is filled with a soft or granular material,
   wherein said casing can be used to store a laptop computer, and
   wherein the laptop computer is stored inside the casing.

2. The laptop computer support platform according to claim 1, wherein the laptop support member(s) is/are secured to said base member by means of fastening members provided on that side of the base member which is opposite that side of base member where the support member/s are located, and wherein the laptop support member(s) and the fastening members are connected with one another through said holes.

3. The laptop computer support platform according to claim 1, wherein said cap is domed.

4. The laptop computer support platform according to claim 1, wherein the flexible laptop support base member consist of foam, rubber or other polymeric material having features in terms of flexibility and semi-rigdity corresponding to those of foam rubber.

5. The laptop computer support platform according to claim 1, wherein said casing is made of a textile material, which is provided with holes corresponding with the holes in the base member.

6. The laptop computer support platform according to claim 1, wherein said one or more laptop support member(s) has/have a vertical extension from the top surface between 3 and 30 mm and a horizontal extension between 3 and 300 mm in one horizontal direction and between 3 and 300 mm in a perpendicular direction.

7. The laptop computer support platform according to claim 1, wherein said one or more laptop support member(s) is/are removable.

8. The laptop computer support platform according to claim 1, wherein said casing can be used to store item(s), wherein the item(s) are stored inside the casing.

* * * * *